US006869815B2

(12) United States Patent
Gasparyan et al.

(10) Patent No.: US 6,869,815 B2
(45) Date of Patent: Mar. 22, 2005

(54) ELECTRO-MECHANICAL DEVICE HAVING A CHARGE DISSIPATION LAYER AND A METHOD OF MANUFACTURE THEREFOR

(75) Inventors: Arman Gasparyan, New Providence, NJ (US); Sungho Jin, San Diego, CA (US); Herbert R. Shea, Washington Township, NJ (US); Robert B. Van Dover, Maplewood, NJ (US); Wei Zhu, Warren, NJ (US)

(73) Assignee: Agere Systems Inc., Allentown, PA (US)

( * ) Notice: Subject to any disclaimer, the term of this patent is extended or adjusted under 35 U.S.C. 154(b) by 187 days.

(21) Appl. No.: 10/226,930

(22) Filed: Aug. 22, 2002

(65) Prior Publication Data

US 2004/0047546 A1 Mar. 11, 2004

(51) Int. Cl.[7] .............................................. H01L 21/00
(52) U.S. Cl. .............................. 438/29; 438/69; 438/78
(58) Field of Search ............................ 438/29–32, 38, 438/69–79, 50–52

(56) References Cited

U.S. PATENT DOCUMENTS 6,387,787 B1 * 5/2002 Mancini et al. ............. 438/586
2004/0012838 A1 * 1/2004 Huibers ...................... 359/291

* cited by examiner

Primary Examiner—Matthew Smith
Assistant Examiner—Calvin Lee

(57) ABSTRACT

The present invention provides a micro-electro-mechanical system (MEMS) device, a method of manufacture therefore, and an optical communications system including the same. The device includes an electrode located over a substrate and a charge dissipation layer located proximate and electrically coupled to the substrate. The device may further include a moveable element located over the electrode.

23 Claims, 13 Drawing Sheets

ELECTRO-MECHANICAL DEVICE HAVING A CHARGE DISSIPATION LAYER AND A METHOD OF MANUFACTURE THEREFOR

TECHNICAL FIELD OF THE INVENTION

The present invention is directed, in general, to an electro-mechanical device and, more specifically, to an electro-mechanical device having a charge dissipation layer, a method of manufacture therefor, and an optical communications system including the same.

BACKGROUND OF THE INVENTION

Optical communications systems typically include a variety of optical devices, for example, light sources, photo detectors, switches, cross connects, attenuators, modulators, mirrors, amplifiers, or filters. The optical devices transmit optical signals in the optical communications systems. Some optical devices are coupled to electro-mechanical structures, such as thermal actuators, forming an electro-mechanical optical device. The term electro-mechanical structure, as used herein, refers to a structure that moves mechanically under the control of an electrical signal.

Some electro-mechanical structures move the optical devices from a predetermined first position to a predetermined second position. Cowan, William D., et al., "Vertical Thermal Actuators for Micro-Opto-Electro-Mechanical Systems," SPIE, Vol. 3226, pp. 137–146 (1997), describes one such electro-mechanical structure useful for moving optical devices in such a manner.

These micro-electro-mechanical system (MEMS) optical devices often employ a periodic array of micro-machined mirrors, each mirror being individually movable in response to an electrical signal. For example, the mirrors can each be cantilevered and moved by an electrostatic, piezoelectric, magnetic, or thermal actuation. See articles by L. Y. Lin, et al., IEEE Photonics Technology Lett. Vol. 10, p. 525, 1998, R. A. Miller, et al. Optical Engineering Vol. 36, p. 1399, 1997, and by J. W. Judy et al., Sensors and Actuators, Vol. A53, p. 392, 1996, which are incorporated herein by reference.

The mirrors used in these optical devices are typically made up of a material which reflects light with high reflectivity at a desired operating wavelength of the light, for example an operating wavelength ranging from about 1000 nm to about 1600 nm for $SiO_2$ optical fiber-based telecommunication systems. Some examples of such reflective materials are gold, silver, rhodium, platinum, copper, aluminum and their alloys. These reflective metal films typically have a thickness ranging from about 20 nm to about 2000 nm, and are deposited on a movable membrane substrate such as a polysilicon or silica substrate. At least one adhesion-promoting bond layer is desirably added between the reflective metal film and the substrate in order to prevent the reflective metal film from getting peeled off. Examples of such adhesion-promoting bond layers include titanium, zirconium, hafnium, chromium and tantalum.

A typical MEMS mirror comprises a metal-coated silicon mirror movably coupled to a surrounding silicon frame via a gimbal. Two torsional members on opposite sides of the mirror connect the mirror to the gimbal, defining the mirror's axis of rotation. The gimbal, in turn, is coupled to the surrounding silicon frame via two torsional members defining a second axis of rotation orthogonal to that of the mirror. Using the typical MEMS mirror, a light beam can be reflected and steered in any direction.

Commonly, electrodes are disposed in a cavity underlying the mirror and the gimbal. Voltages applied between the mirror and an underlying electrode, and between the gimbal and an electrode, electrostatically control the orientation of the mirror. Alternatively, an electrical current can control the position of the mirror magnetically, thermally or piezoelectrically.

The tilting of each mirror is controlled by applying specific electric fields to one or more of the electrodes beneath the mirror. Undesirable variations in the gap spacing between the mirror layer and the electrode layer, symmetric or nonsymmetric, may alter the electric field for the applied field, which affects the degree of electrostatic actuation and hence the degree of mirror tilting. This, in turn, alters the path or coherency of light signals reaching the receiving fibers, thus increasing the signal loss during beam steering.

Turning to Prior Art FIGS. 1 and 2, illustrated is a typical MEMS mirror device and its application. FIG. 1 illustrates a prior art optical MEMS mirror device 100. The device 100 comprises a mirror 110 coupled to a gimbal 120 on a polysilicon frame 130. The components are fabricated on a substrate (not shown) by micromachining processes such as multilayer deposition and selective etching. After etching, the mirror 110, the gimbal 120 and the polysilicon frame 130, are raised above the substrate by upward bending lift arms 140, typically using a release process.

The mirror 110 in the example illustrated in FIG. 1, is double-gimbal cantilevered and attached onto the polysilicon frame 130 by springs 150. The mirror 110 can be tilted to any desired orientation for optical signal routing via electrostatic or other actuation, using electrical voltage or current supplied from outside. Typically, the mirror 110 includes a light-reflecting mirror surface 160 coated over a polysilicon membrane 170, which is typically of circular shape. The light-reflecting mirror surface 160 is generally deposited by known thin film deposition methods, such as evaporation, sputtering, ion-beam, electrochemical or electroless deposition, or chemical vapor deposition.

Turning briefly to Prior Art FIG. 2, illustrated is an important application of the mirror 110 illustrated in FIG. 1. FIG. 2 illustrates an optical cross connect system 200 for optical signal routing, including an array of mirrors 210. The optical cross connect system 200 shown in FIG. 2 includes an optical input fiber 220, an optical output fiber 230 and the array of MEMS mirrors 210, including a primary mirror 212 and an auxiliary mirror 215. As is illustrated, an optical signal from the input fiber 220 is incident on the primary mirror 212. The primary mirror 212, with the aid of the auxiliary mirror 215, is electrically controlled to reflect the incident optical signal to the optical output fiber 230. In alternative schemes, the input fibers and the output fibers are in separate arrays, and a pair of MEMS mirror arrays are used to perform the cross connect function.

An array of such MEMS mirrors is essentially composed of two layers: a mirror layer comprising the array of mirror elements movably coupled to a surrounding frame, and an actuator layer comprising the electrodes and conductive paths needed for electrical control of the mirrors. One approach to fabricating the array is to fabricate the actuator layer and the mirror layer as successive layers on the same workpiece and then to lift up the mirror layer above the actuator layer using vertical thermal actuators or using stresses in thin films, e.g., see FIG. 1.

An alternative approach is to fabricate the mirror layer on one substrate, the actuator layer on a separate substrate and then to assemble the mating parts with accurate alignment and spacing, such as shown in the device 300 of Prior Art FIG. 3. A two-part assembly process is described in U.S. Pat. No. 6,201,631 issued to Greywall on Mar. 13, 2001, which is incorporated herein by reference. Such two-part assembly processes generally provide a more robust structure, greater packing density of the movable mirrors, and permit larger mirror sizes and rotation angles, in addition to being easily scalable for larger arrays using silicon fabrication processes.

The movable membrane in such a MEMS device is preferably made of single crystal silicon, and is typically only several micrometers thick. Such a thin silicon membrane is made, for example, by using the well-known silicon-on-insulator (SOI) fabrication process. The SOI process allows a convenient way of fabricating a thin silicon membrane, and the presence of a buried oxide layer is useful as an etch-stop barrier in photolithographical fabrication of the mirror, gimbal and spring/torsion bar structures. Selected patterned areas of the SOI substrate are etched, e.g., by using chemical etch, reactive-ion etch, or a combination of these processes to form the mirror array pattern with cavity structure. The gimbals and the torsion bars are also formed around each mirror. The SOI material and process are described, for example, in *Concise Encyclopedia of Semiconducting Materials and Related Technologies*, Edited by S. Mahajan and L. C. Kimmerling, Pergamon Press, New York, 1992, p. 466.

The above-mentioned optical devices are presently used, however, they still have certain reliability issues. One such reliability issue, whether it occur in optical MEMS cross-connects, dynamic gain equalizers, or other related devices, is the undesirable drifting of the electrostatically-actuated angle.

Accordingly, what is needed in the art is an electromechanical device, and method of manufacture therefor, that does not encounter the undesirable drifting experienced by the prior art devices.

SUMMARY OF THE INVENTION

To address the above-discussed deficiencies of the prior art, the present invention provides a micro-electromechanical system (MEMS) device, a method of manufacture therefore, and an optical communications system including the same. The device includes an electrode located over a substrate and a charge dissipation layer located proximate and electrically coupled to the substrate. The device may further include a moveable element located over the electrode.

The present invention is further directed to a method of manufacturing the device. The method includes: (1) providing a substrate, (2) creating an electrode over the substrate, (3) forming a charge dissipation layer proximate and electrically coupled to the substrate, and (4) placing a moveable element over the electrode.

The foregoing has outlined preferred and alternative features of the present invention so that those skilled in the art may better understand the detailed description of the invention that follows. Additional features of the invention are described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

Prior Art

DETAILED DESCRIPTION

In optical MEMS devices, such as optical cross-connects, electrodes may be disposed in a cavity underlying a conventional mirror and the gimbal structure. As is well known, voltages applied between the mirror and an underlying electrode, and between the gimbal and an electrode, electrostatically control the orientation of the mirror. A problem with traditional mirror and gimbal structures is the undesirable drifting of the electrostatically-actuated angle created when applying the voltages between the mirror and underlying electrode and gimbal and underlying electrode, respectively.

The present invention, without being limited to such a postulation, believes that the undesirable drift in part results from time-dependent accumulation or change of electrostatic charge on insulating layers, such as on the $SiO_2$ dielectric layer located on voltage-actuating electrode chips. For example, it is thought that the dielectric used to electrically insulate neighboring electrodes may contain (electron or hole) traps, or mobile ions located somewhere therein. A static charge build-up on or in the dielectric layer may change the effective bias of those electrodes, and hence, change the response of the device compared to the uncharged state.

It is believed that by placing a charge dissipation layer proximate and electrically coupled to the substrate (e.g., the aforementioned $SiO_2$ dielectric layer), the static charge build-up on or in the substrate may be substantially reduced. Accordingly, it is believed that the undesirable drifting of the electrostatically-actuated angle may be minimized by using such a charge dissipation layer.

Figure 1:
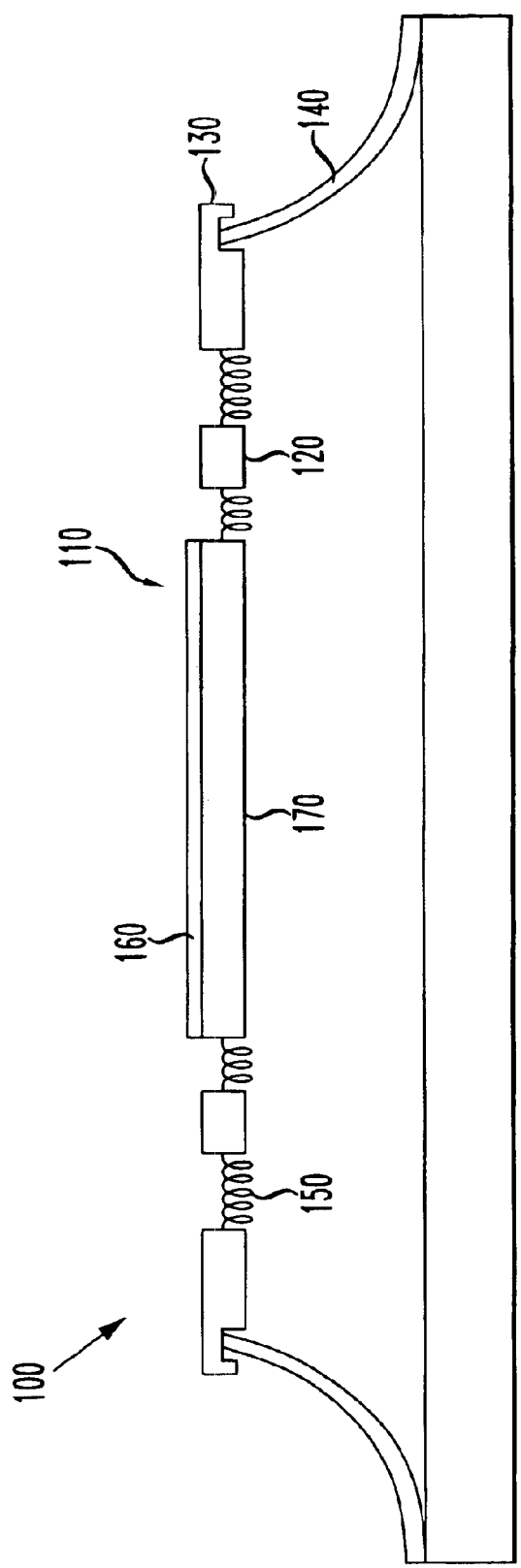
FIG. 1 illustrates a prior art optical MEMS mirror device.
Figure 2:
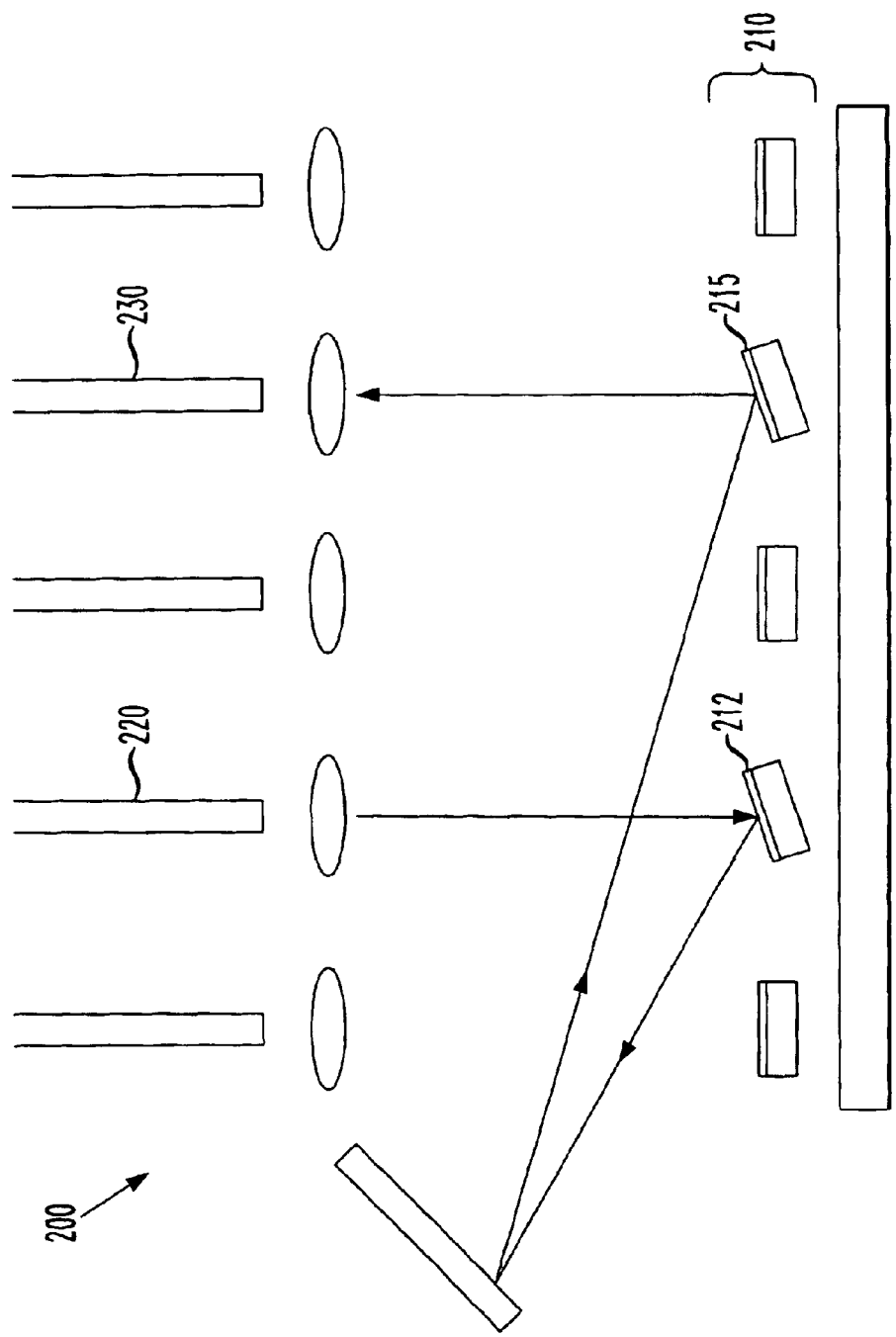
FIG. 2 illustrates an important application of the mirror illustrated in FIG. 1.
Figure 3:
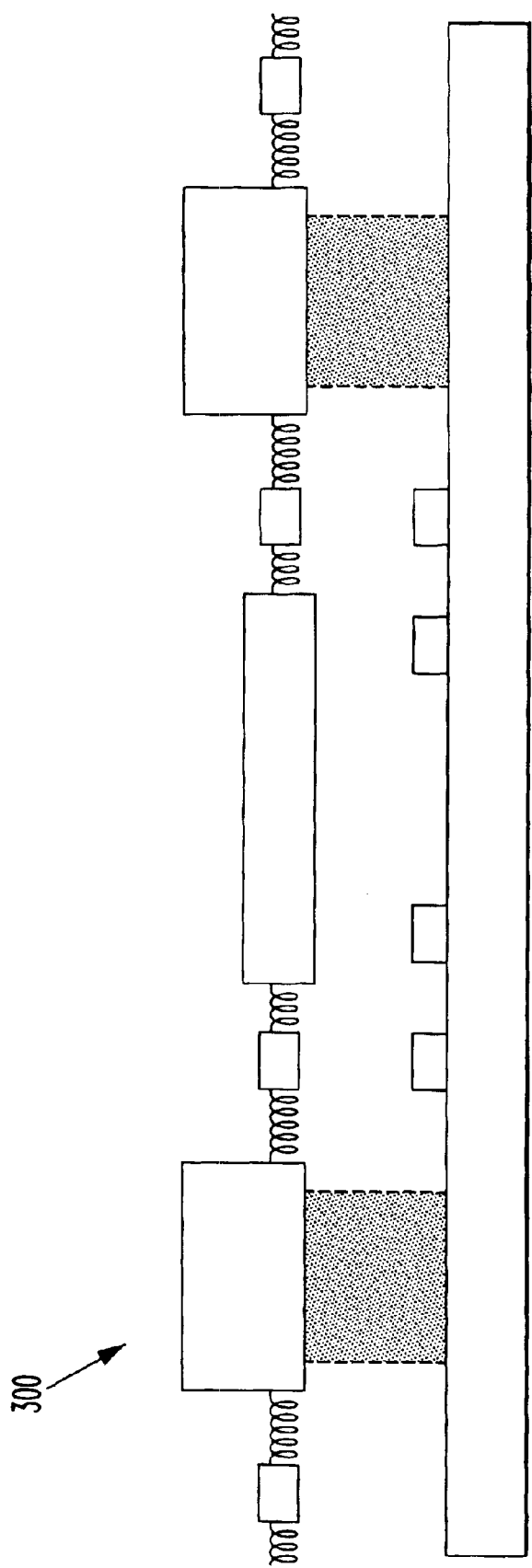
FIG. 3 illustrates an alternative prior art optical MEMS mirror device.
Figure 4:
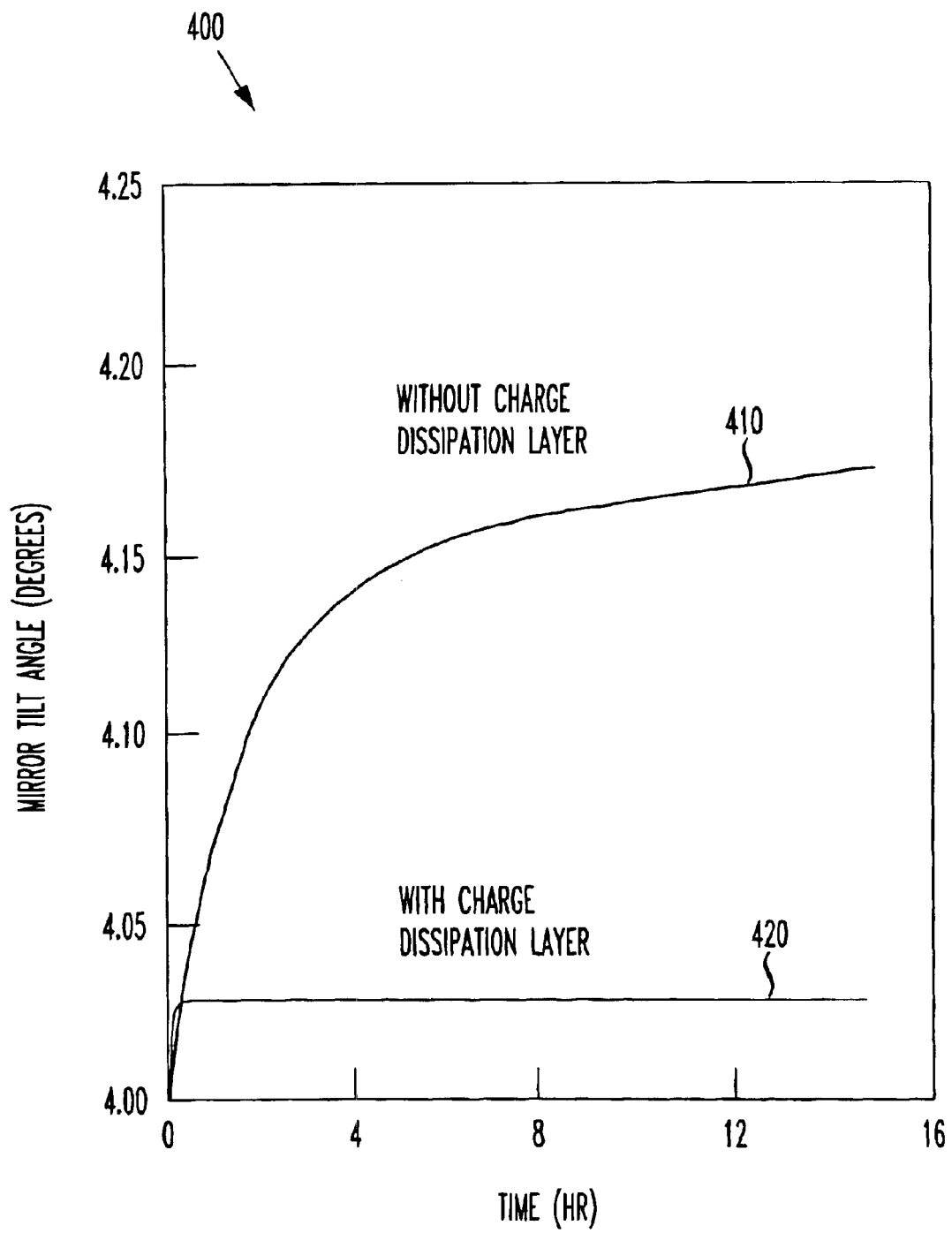
FIG. 4 illustrates a graph 400 supporting the belief that by placing a charge dissipation layer proximate and electrically coupled to the substrate, static charge build-up on or in the substrate may be substantially reduced.

Turning briefly to FIG. 4, illustrated is a graph 400 supporting the aforementioned postulation. Graph 400 includes a first measurement 410 which represents mirror angle drift data for a conventional micro-electro-mechanical system (MEMS) device, such as that shown in FIG. 3. Graph 400 further includes a second measurement 420 which represents mirror angle drift data for a micro-electromechanical system (MEMS) device in accordance with the principles of the present invention.

The conventional MEMS device represented by the first measurement 410 consists of an 875 μm diameter mirror coated with a light-reflecting metallization layer. As illustrated by the first measurement 410, drift continues with time, becomes unacceptably large, and does not stop even after 24 hours.

The MEMS device represented by the second measurement 420 consists of an identical device as that of the conventional MEMS device represented by the first measurement 410, however, the MEMS device represented by the second measurement 420 further includes a charge dissipation layer in accordance with the principles of the present invention. In the particular example used, the MEMS device represented by the second measurement 420 includes a 40 nm thick charge dissipation layer located proximate and electrically coupled to the substrate. The charge dissipation layer in the example at hand comprises $CoFe_2O_4$, however, it should be noted that other materials could be used.

It is evident from the data in FIG. 4 that the presence of the charge dissipation layer dramatically reduces the mirror angle drift by orders of magnitude, and provides a stabilized mirror angle with time. The undesirable drift may be reduced in the inventive optical MEMS device by a factor of at least 10, as compared with an identical device without the added charge dissipation layer. It is preferred, given the right conditions, that the undesirable drift be reduced by a factor of 100, and even more preferred, by a factor of about 1000. The desired degree of mirror angle drift is small, for example, at most 0.05 degrees of change, and preferably at most 0.02 degrees over the time period of 48 hours.

Figure 5:
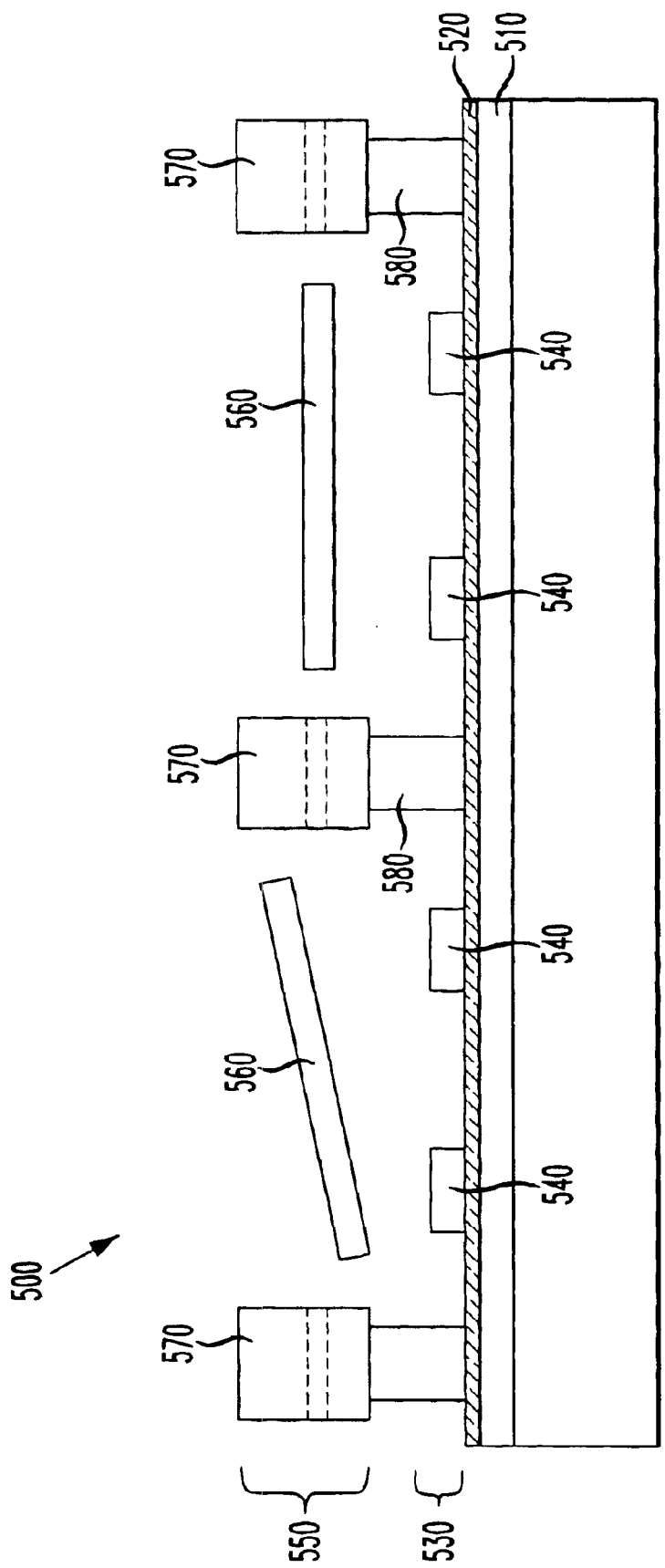
FIG. 5 illustrates a cross-sectional view of a MEMS device manufactured in accordance with the principles of the present invention.

Turning now to FIG. 5, illustrated is a cross-sectional view of a MEMS device 500, manufactured in accordance with the principles of the present invention. In the particular embodiment shown in FIG. 5, the MEMS device 500 is an exemplary two-part MEMS device. While a two-part MEMS device is shown and discussed with respect to the present invention, those skilled in the art understand that the inventive aspects of the present invention are equally applicable to other MEMS devices, including those discussed in the background section above.

In the embodiment of FIG. 5, the MEMS device 500 includes a substrate 510 having a charge dissipation layer 520 located proximate and electrically coupled thereto. The substrate 510 may comprise a variety of materials while staying within the scope of the present invention. For example, it is common for the substrate 510 to comprise a material susceptible to static charge build-up, among other things. One well known and commonly used material susceptible to static charge build-up, and within the scope of the present invention, is a $SiO_2$ dielectric layer. However, as previously stated, others are within the scope of the present invention.

As previously recited, the charge dissipation layer 520 is located proximate and electrically coupled to the substrate 510. Various conductive or semi-conductive materials may be contemplated for use as the charge dissipation layer 520. For example, the charge dissipation layer 520 may be comprised of a material selected from several groups of materials.

Mixed valence oxides such as cobalt iron oxide ($CoO.Fe_2O_3$ or $CoFe_2O_4$), nickel iron oxide ($NiO.Fe_2O_3$ or $NiFe_2O_4$), or nickel zinc iron oxide ($[NiO+ZnO]_1.Fe_2O_3$ or $[Ni+Zn]_1Fe_2O_4$), manganese zinc iron oxide($[MnO+ZnO]_1.Fe_2O_3$) or even the simplest case of iron-iron oxide ($FeO.Fe_2O_3$) may be used. These materials are commonly known as ferrites. These include ferrite materials of the barium iron oxide and strontium iron oxide type.

$CoFe_2O_4$ in bulk polycrystalline form has some properties that make it a particularly good candidate for use as the charge dissipation layer 520. $CoFe_2O_4$ has a high resistivity, typically in the $10^7$–$10^8$ ohm-cm range, because the Co strongly prefers to be divalent, so charge neutrality demands that the Fe be trivalent. Excess conductivity in ferrites usually comes from valence fluctuations associated with the presence of divalent Fe in the midst of trivalent Fe atoms (hopping conductivity). Thus, the conductivity of $CoFe2O_4$ is in the desired range for the present invention.

Also, mixed valence oxides such as gadolinium iron oxide ($Gd_3Fe_5O_{12}$), lanthanum nickel oxide ($LaNiO_3$), lanthanum cobalt oxide ($LaCoO_3$), lanthanum chromium oxide ($LaCrO_3$), lanthanum manganese oxide ($LaMnO_3$) and modified materials based on these, such as lanthanum strontium manganese oxide ($La_{0.67}Sr_{0.33}MnO_x$), lanthanum calcium manganese oxide ($La_{0.67}Ca_{0.33}MnO_x$), or yttrium barium copper oxide ($Y_1Ba_2Cu_3O_x$), are within the scope of the present invention. These materials are commonly known as rare-earth and non-rare-earth mixed metal oxides.

In addition to the mixed valence oxides, single or multi-oxide materials containing valence defects are particularly beneficial for use as the charge dissipation layer 520. For example, $TiO_2$ which is normally insulating can be altered to exhibit slight conductivity by introducing defects which would make the Ti to be a mix of trivalent $Ti^{+3}$ and quadrivalent $Ti^{+4}$ with resultant electron hopping conductivity. Such defects can be introduced by using thin film deposition techniques which provide non-equilibrium structures such as point defects, dislocations, locally strained lattices, and local fluctuations in chemistry. The use of hot substrates or very slow deposition rates generally produces structures closer to equilibrium, thus are undesirable for obtaining such defect structures.

These mixed-valence oxide materials such as the Co-rich $CoFe_2O_4$ have electrical resistivity that is relatively insensitive to the thin film deposition processing conditions. For example, the attainment of a desirable stoichiometry is not critically dependent on the variation of deposition specifics. This makes it desirable for sputter deposition (single target process or co-deposition using multi-target process) as well as for some other deposition methods such as evaporation, electro-deposition, etc. As the resultant cation composition of the deposited film may not always be close to the target composition, the use of these mixed valence oxide materials provides reasonable process latitude. Another advantage of this moderate variation of resistivity with composition is that it allows a convenient and not too drastic handle for controlling the conductivity to the desired value. Yet another advantage of these voltage-stabilizing materials is that the oxygen stoichiometry, and the electrical resistivity of the already deposited film can still be altered or tailored, e.g., using a post-deposition heat treatment using reducing or oxidizing atmosphere. The mixed-oxide films added in the inventive devices can have either an amorphous structure (e.g., x-ray amorphous), or have a crystalline structure.

While many materials have been listed as within the scope of the present invention, not all materials behave in a desirable manner, especially those made up of Si and $SiO_2$ based materials. For example, the well-known, Si-based layer of $(Si+SiN_x)$ mixed material consisting of, e.g., about 60% Si and about 40% $SiN_x$, does not sufficiently resolve the observed problem of mirror tilt angle drift, as the boundary region between the added $SiN_x$ layer and the underlying $SiO_2$ insulator tends to undesirably cause bulk charge trapping and contribute to the drift problem.

The desired level for the electrical resistivity of the charge dissipation layer 520 may encompass a large range of values. For example, values in the range of about $10^2$–$10^{12}$ ohm-cm, preferably about $10^4$–$10^{10}$ ohm-cm, and even more preferably about $10^5$–$10^9$ ohm-cm, are well within the scope of the present invention. Other electrical resistivity values are, however, within the scope of the present invention.

Similar to the electrical resistivity values, the thickness of the charge dissipation layer 520 may vary greatly. For example, thickness values ranging from about 2 nm to about 200 nm, preferably from about 5 nm to about 100 nm, and even more preferably from about 10 nm to about 60 nm are quite useful. While specific values have been given for the thickness of the charge dissipation layer 520, those skilled in the art understand that the present invention is not limited to such thicknesses. Additionally, it should be noted that the charge dissipation layer 520 thickness can be balanced with the resistivity, as the total electrical resistance is the product of the two values.

In the particular embodiment shown in FIG. 5, the charge dissipation layer 520 has been blanket formed on the entire surface of the substrate 510. The preferred method for forming the charge dissipation layer 520 includes DC or RF sputter deposition (single target process or co-deposition using multi-target process), as well as some other deposition methods such as ion beam deposition, thermal co-evaporation, electron beam evaporation, chemical vapor deposition, or electro-deposition. Inert gas atmosphere deposition or reactive deposition (such as in oxygen atmosphere) may also be used. While specific methods for forming the charge dissipation layer 520 have been listed, any other known or hereafter discovered method is within the scope of the present invention.

Figure 7:
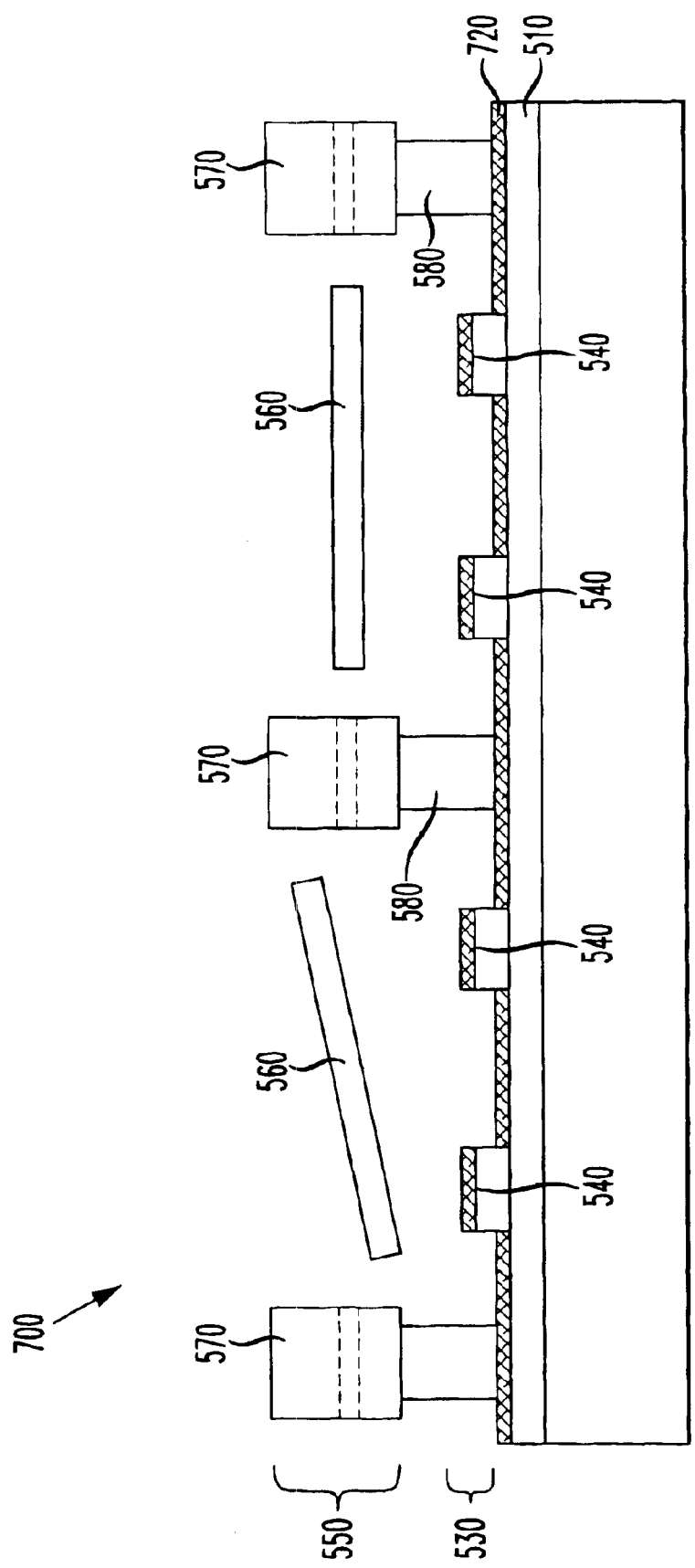
FIG. 7 illustrates a cross-sectional view of an alternative embodiment of a MEMS device in accordance with the principles of the present invention.
Figure 8:
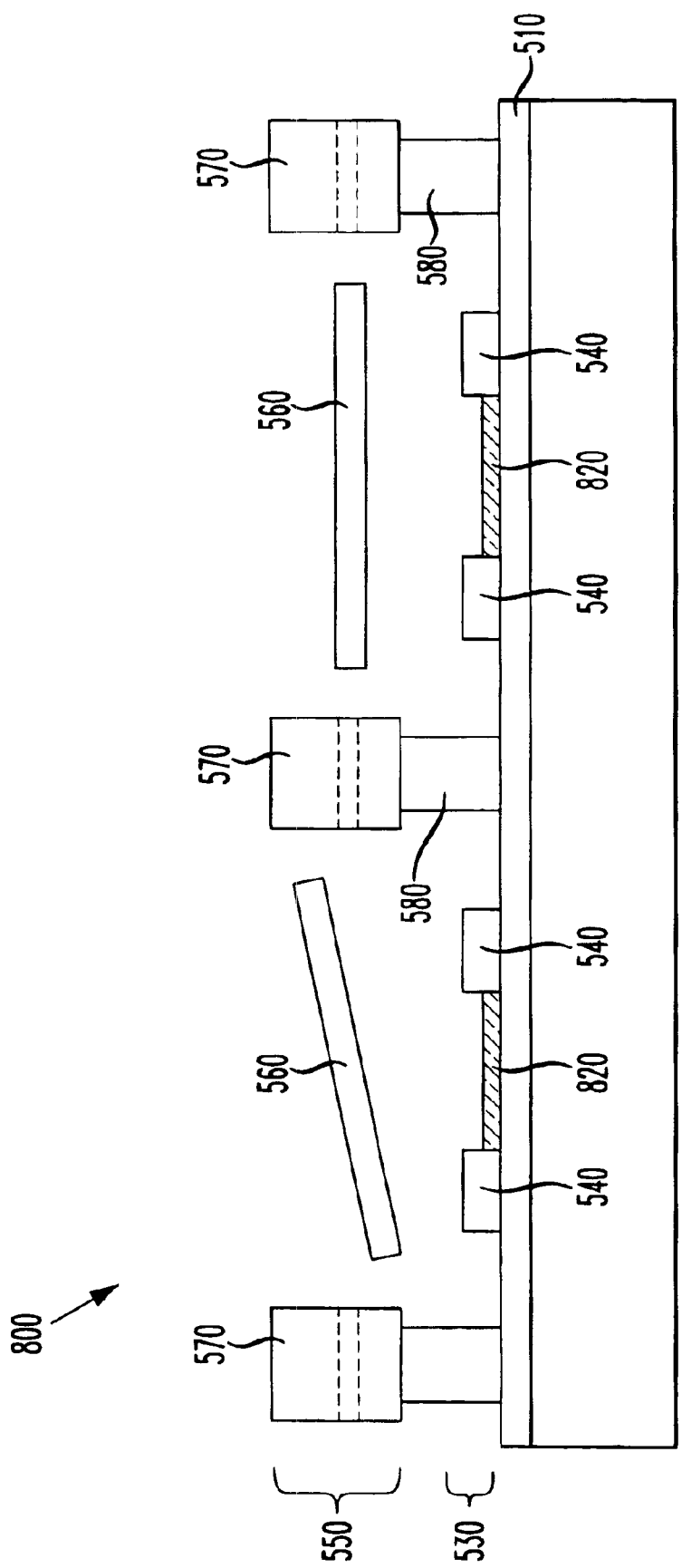
FIG. 8 illustrates a cross-sectional view of an alternative embodiment of a MEMS device in accordance with the principles of the present invention.

After the formation of the charge dissipation layer 520 in FIG. 5, a conventional electrode layer 530 may be formed thereover. In the illustrative embodiment of FIG. 5, the electrode layer 530 includes at least one actuating electrode 540, and leads (not shown), for applying voltage between the electrode 540 and a moveable element 560. In the particular embodiment shown in FIG. 5, the electrode layer 530 is formed over the substrate 510 and on the charge dissipation layer 520. Other different placements, including those shown in FIGS. 6–8, are, however within the scope of the present invention.

After formation of the charge dissipation layer 520 in FIG. 5, a conventional actuating layer 550 may also be created, and depending on the embodiment, mated to the substrate 510. In the illustrative embodiment of FIG. 5, the conventional actuating layer 550 includes the moveable element 560 (e.g., a mirror), which is movably coupled to a conventional mounting substrate 570. As shown, the actuating layer 550 is mechanically attached, e.g., by solder bonding or epoxy bonding, to the electrode layer 530 with a controlled vertical gap spacing, which can be controlled, e.g., by using a fixed thickness spacer 580.

By placing the charge dissipation layer 520 proximate and electrically connected to the substrate 510, the static charge build-up on or in the substrate may be substantially reduced. Thus, it is believed that the undesirable drifting of the electrostatically-actuated angle may be minimized by using the charge dissipation layer 520.

Figure 6:
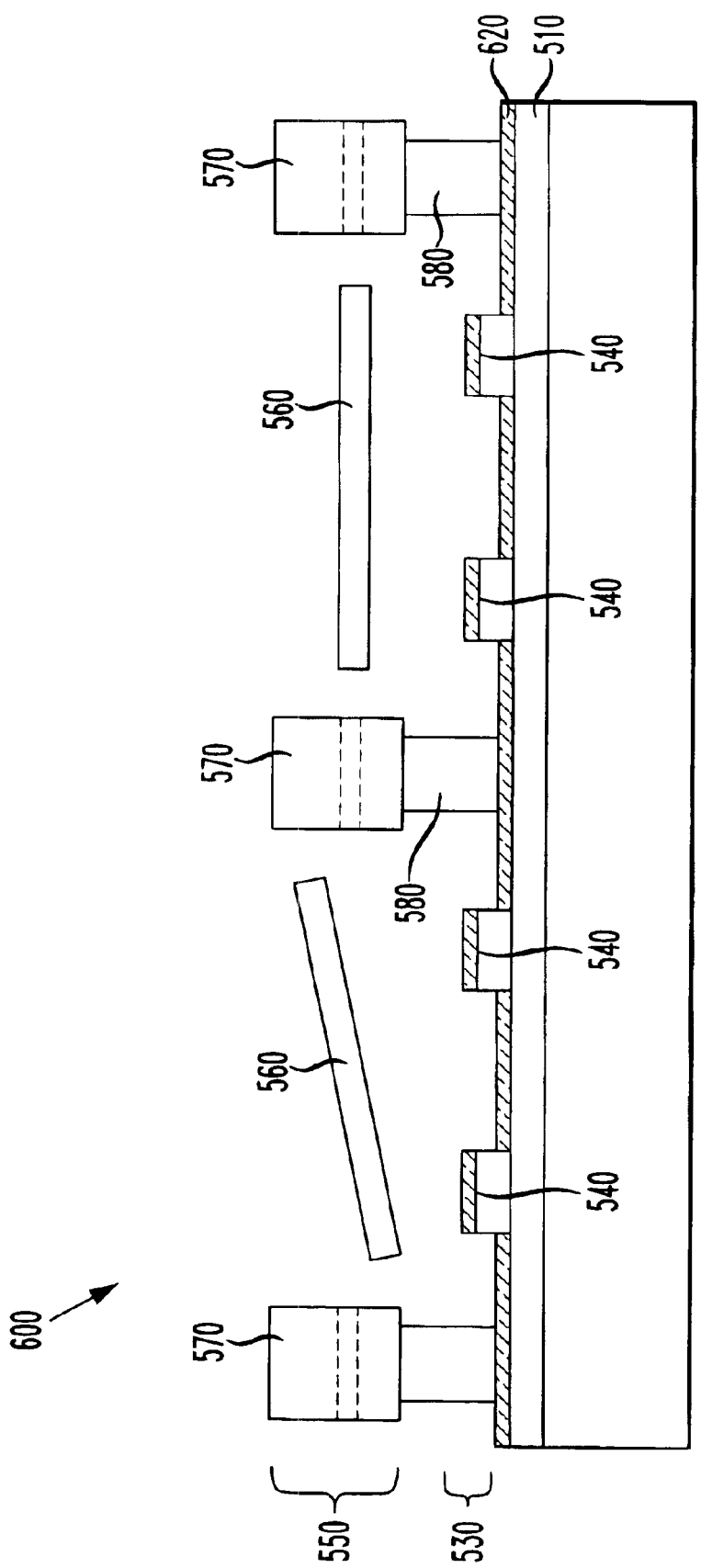
FIG. 6 illustrates a cross-sectional view of another embodiment of a MEMS device constructed in accordance with the principles of the present invention.

Turning now to FIG. 6, illustrated is a cross-sectional view of another embodiment of a MEMS device 600 constructed in accordance with the principles of the present invention. With the exception of the placement of a charge dissipation layer 620, the MEMS device 600 is similar to the MEMS device 500 illustrated in FIG. 5. In the illustrative embodiment shown, the charge dissipation layer 620 is located on the substrate 510, however, over the electrodes 540. In such an embodiment, the charge dissipation layer 620 (as compared to the charge dissipation layer 520) may be formed after the formation of the electrodes 540. Those skilled in the art understand the techniques that could be used to form the charge dissipation layer 620 in such a fashion, including all of the methods discussed above with respect to the charge dissipation layer 520.

Turning briefly to FIG. 7, illustrated is a cross-sectional view of an alternative embodiment of a MEMS device 700 in accordance with the principles of the present invention. The MEMS device 700 of FIG. 7 includes a charge dissipation layer 720 similar in position to the charge dissipation layer 620 of FIG. 6, however, in the embodiment of FIG. 7, the charge dissipation layer 720 includes a network of conducting material incorporated into a matrix thereof. The size and volume fraction of the conductive material in the network is chosen such that the overall electrical resistivity is not too low, and the in-plane conductive paths by physical contact or percolation of the conductive material are not macroscopically (over long-range) continuous. The desirable volume fraction of the conductive material in the charge dissipation layer 720 of FIG. 7 is about 20% or less, preferably about 10% or less, and even more preferentially about 3% or less.

According to certain aspects of the present invention, the network can be formed by using grain boundary segregation of second phase, by co-deposition of thin films of the insulator (e.g., $SiO_2$) with conductive material such as Ni or Co. Further, a combination of RF sputtering and DC sputtering can be used to co-deposit the insulator and the conductor. The network formation can also be enhanced by using processing schemes involving applied magnetic fields, as the magnetic atoms or particles tend to attract each other to form chains or stringers.

Turning now to FIG. 8, illustrated is a cross-sectional view of an alternative embodiment of a MEMS device 800 in accordance with the principles of the present invention. With the exception of the placement of a charge dissipation layer 820, the MEMS device 800 is similar to the MEMS device 500 illustrated with respect to FIG. 5. In the illustrative embodiment shown, the charge dissipation layer 820 is located on the substrate 510, however, only in an inter-electrode gap created by the electrodes 540. Those skilled in the art understand that the charge dissipation layer 820 may be locally restricted to the inter-electrode gap regions by using a conventional masking, patterning or other similar process.

Figure 9:
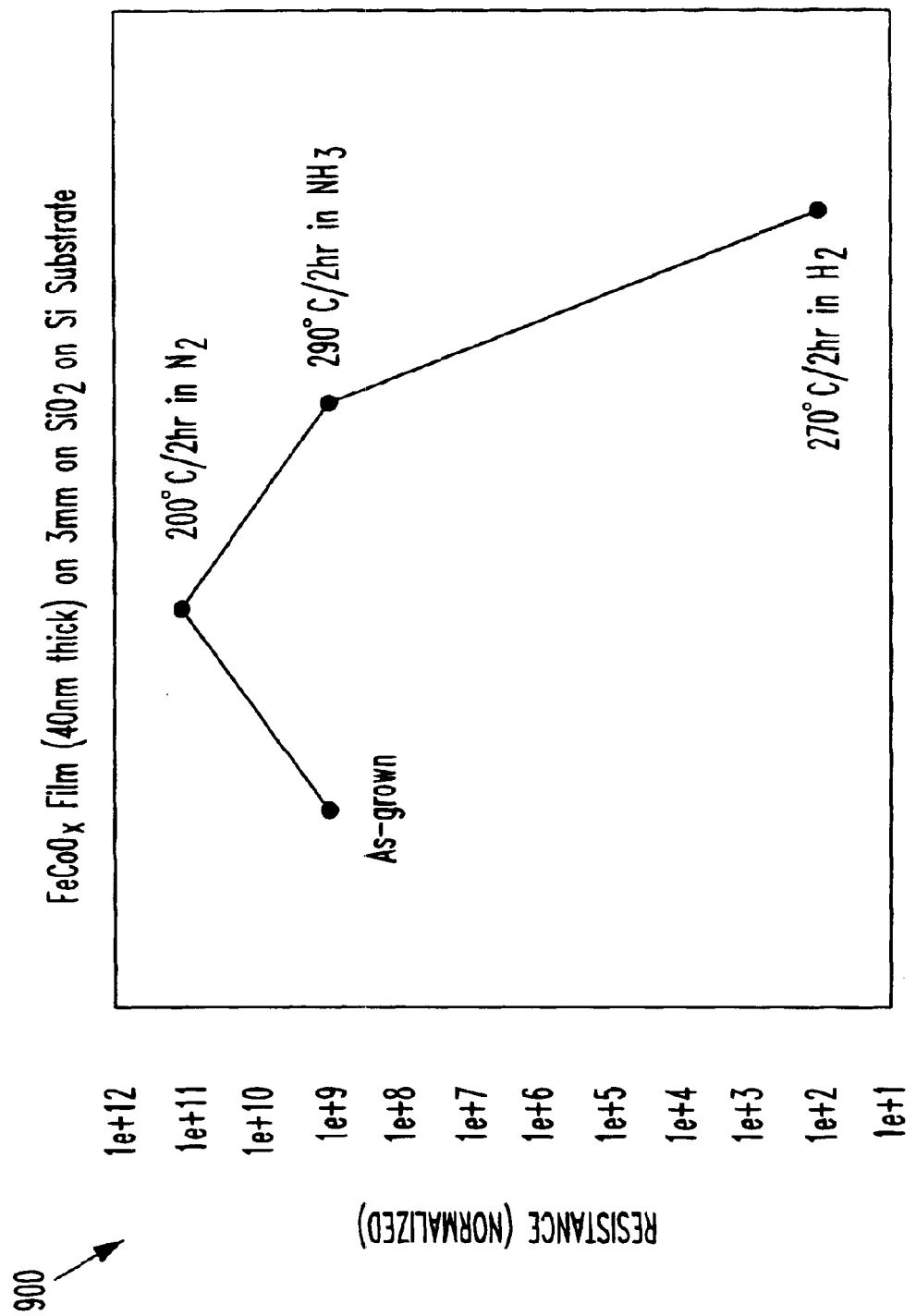
FIG. 9 illustrates data showing how the electrical resistance of a charge dissipation layer is tunable by post-deposition heat treatments in various atmospheres.

Regardless of the configuration of the charge dissipation layer (i.e., whether it be similar to that in FIG. 5, FIG. 6, FIG. 7, FIG. 8, or another embodiment not illustrated) it has been observed that in certain embodiments it is beneficial to tune it using a post-formation heat treatment. Referring to FIG. 9, illustrated is data 900 showing how the electrical resistance of a charge dissipation layer (which in this instance happens to be a $CoFe_2O_4$ charge dissipation layer)

is tunable by post-deposition heat treatments in various atmospheres. In the example given, the electrical resistance of the given $CoFe_2O_4$ film (a 40 nm thick layer, reactive sputter deposited on a 3 μm thick $SiO_2$ layer located on a Si substrate) can be increased by about 2 orders of magnitude with a treatment of 200° C./2 hr in $N_2$. As further illustrated, the $CoFe_2O_4$ film can also be restored back to the original value by 290° C./2 hr in $NH_3$, or can be substantially reduced by as much as about 7 orders of magnitude. Such a tunability of electrical resistivity is convenient for device fabrication, as charge dissipation layers having unoptimized electrical properties can be corrected, and therefore the device yield in manufacturing can be much enhanced.

Those skilled in the art understand the process by which the post-formation heat treatments can be accomplished. For example, the post-formation heat treatment can be performed after deposition of the charge dissipation layer over the substrate, and either before or after mating the electrode layer 530 and actuation layer 550 together (FIG. 5). At this point, or another point if desired, the resistivity can be tuned by baking the charge dissipation layer in a reducing atmosphere or an oxidizing atmosphere. This tuning process can be applied for sufficient duration or at a high enough temperature so as to decrease or increase the electrical resistivity until an optimal value is obtained.

Figure 10:
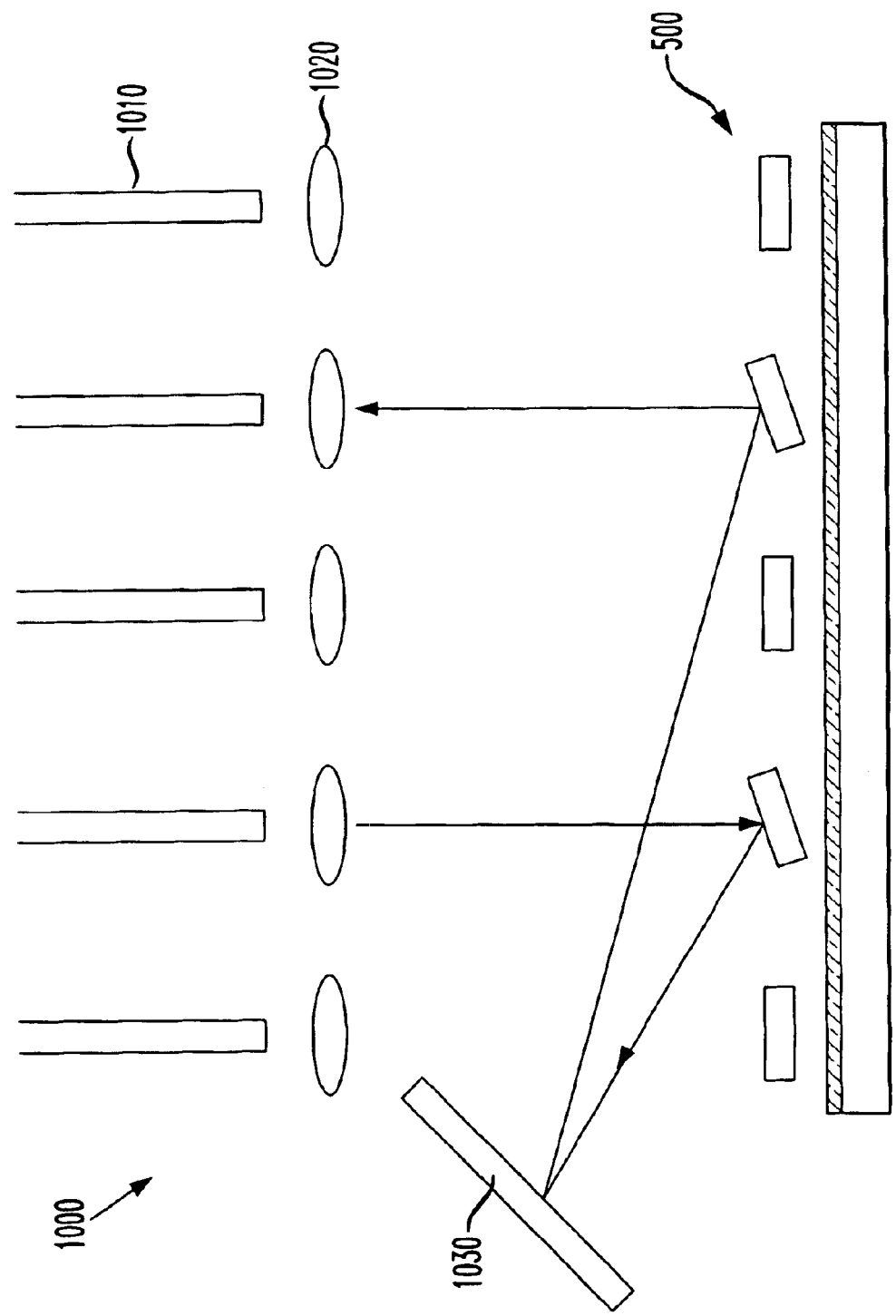
FIGS. 10–13 illustrate optical communications systems in accordance with the principles of the present invention.

Turning to FIG. 10, illustrated is an optical communications system 1000. In the embodiment shown in FIG. 10, the optical communications system 1000 includes input/output fiber bundles 1010, the MEMS device 500 (FIG. 5), imaging lenses 1020 interposed between the input/output fiber bundles 1010 and the MEMS device 500, and a reflector 1030. The optical communications system 1000 represents an optical cross-connect, which is one environment where the MEMS device 500, or another MEMS device within the scope of the present invention, may be used.

Figure 11:
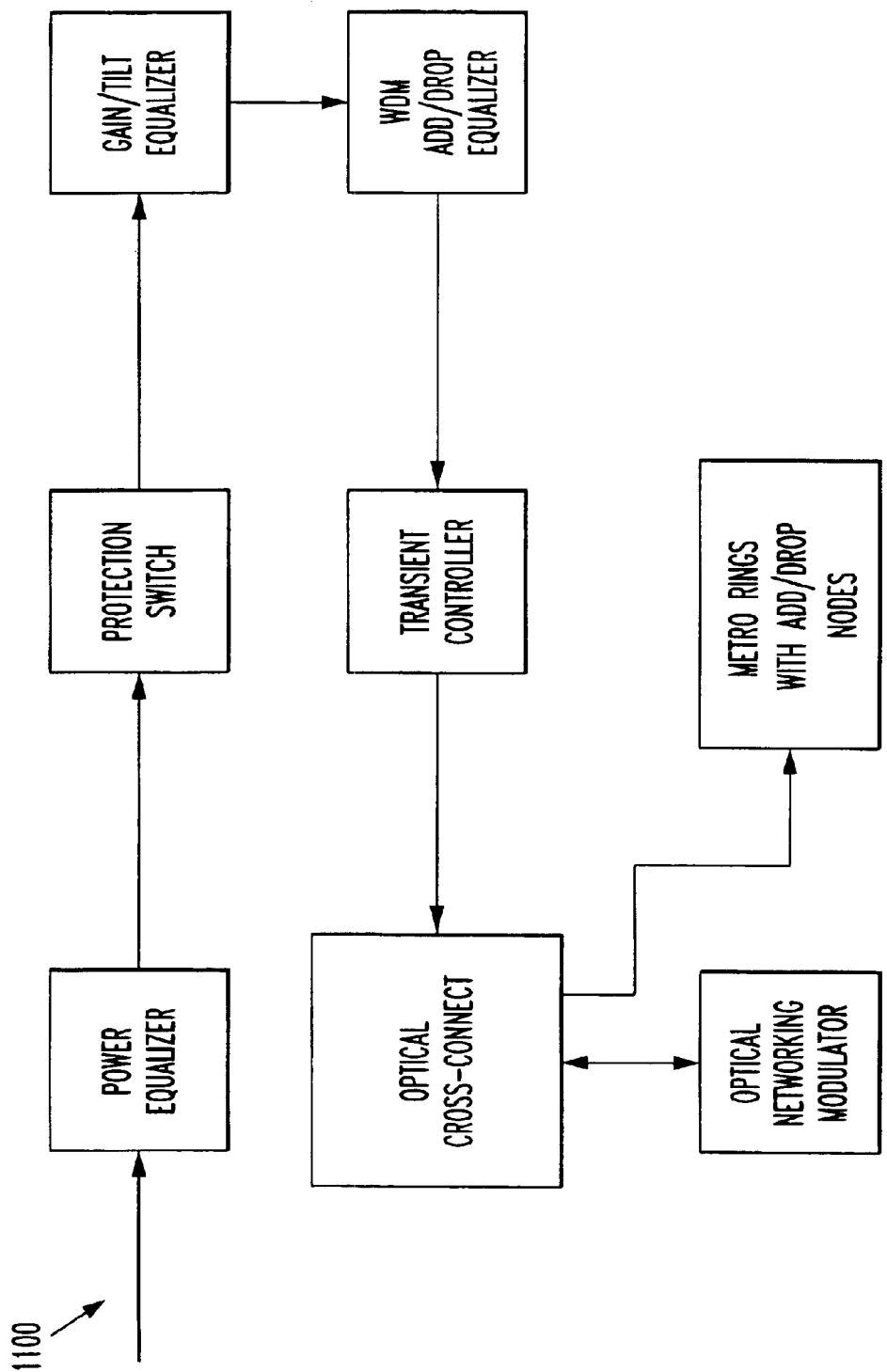

The MEMS device covered by the present invention is useful not only for channel cross-connect, but also for signal rerouting, or signal modification in optical communication networking systems. Schematically illustrated in FIG. 11 is an example of such a communication system 1100 comprising an optical cross connect, and other functional devices. In the cross connect, each movable element receives an optical signal from an incoming channel, and reflects it toward an intended output channel location. The input signal may contain many wavelengths, or alternatively, can be demultiplexed into separate wavelength channels. The inventive MEMS device is also useful for various other light-reflecting mirror systems, since the stability of the mirror tilt angle is essential for reliable operation of most of the MEMS based optical devices. Examples of such devices include those shown in FIG. 11, such as power gain equalizers, switches, wavelength-division-multiplexer (WDM) add/drop devices, optical modulators and optical signal attenuators.

Multi-wavelength optical communication systems will require reconfiguration and reallocation of wavelengths among the various nodes of a network depending on user requirements, e.g., with programmable add/drop elements. One problem limiting the capacity of such systems is that the erbium-doped fiber amplifier, which is often a necessary component in optical communication systems, has a characteristic spectral dependence providing different gain for different wavelength channels. This spectral dependence poses a problem for multichannel WDM systems, because different gains for different channels leads to high bit error rates in some of the channels. As the number of channels passing through the amplifier changes by channel add/drop reconfiguration, the amplifier will start showing deleterious peaks in its gain spectrum at some wavelength channels, requiring modification of the signal spectrum and flattening of the amplifier gains.

One way of flattening the amplifier gain spectrum is to use long period fiber gratings. Long-period fiber grating devices provide wavelength dependent loss and may be used for spectral shaping. See an article by A. M. Vengsarkar et al., *Optical Letters* Vol. 21, p. 336, (1996). A long-period grating couples optical power between two co-propagating modes with very low back reflections. A long-period grating typically comprises a length of optical waveguide wherein a plurality of refractive index perturbations are spaced along the waveguide by a periodic distance, which is large compared to the wavelength of the transmitted light. Long-period fiber grating devices selectively remove light at specific wavelengths by mode conversion. In contrast with conventional Bragg gratings, in which light is reflected and stays in the waveguide core, long-period gratings remove light without reflection, as by converting it from a guided mode to a non-guided mode. A non-guided mode is a mode which is not confined to the core, but rather, is defined by the entire waveguide structure, e.g., based on a cladding mode.

A difficulty with conventional long-period gratings, however, is that their ability to dynamically equalize amplifier gain is limited, because they filter only a fixed wavelength acting as wavelength-dependent loss elements. Such dynamic gain equalizers based on reconfigurable long-period gratings have been disclosed, for example, in the U.S. Pat. No. 5,999,671 (Jin, et al.).

It is desirable to be able to equalize amplifier gains over a broad range of wavelengths covering many wavelength channels. Therefore, it would be beneficial to utilize many simultaneously operating mirrors, each representing one specific demultiplexed wavelength. The design and size scale of the dynamic gain equalizer devices is tailored so that the range of wavelength spectrum and the number of wavelength channels simultaneously controllable, can be optimized and increased if necessary.

In the inventive dynamic gain equalizer based on the inventive MEMS device, the optical signal gain in each wavelength channel can be independently, and simultaneously with other channels, controlled by a multitude of mirrors included within the MEMS device that reflects that particular signal. The multiplexed optical signal is demultiplexed using suitable demultiplexers such as planar waveguides or thin film devices, with each of the separated wavelength channel signals being sent to each mirror and reflected. By programmably selecting the tilt angle of relevant mirrors slightly off the angle of maximum signal reflection, the losses for various wavelength channels can be intentionally increased to different degrees for the purpose of gain equalizing. Minimizing unwanted drift problems using the inventive charge dissipation layer is crucial in ensuring the accuracy of dynamic gain control.

Figure 12:
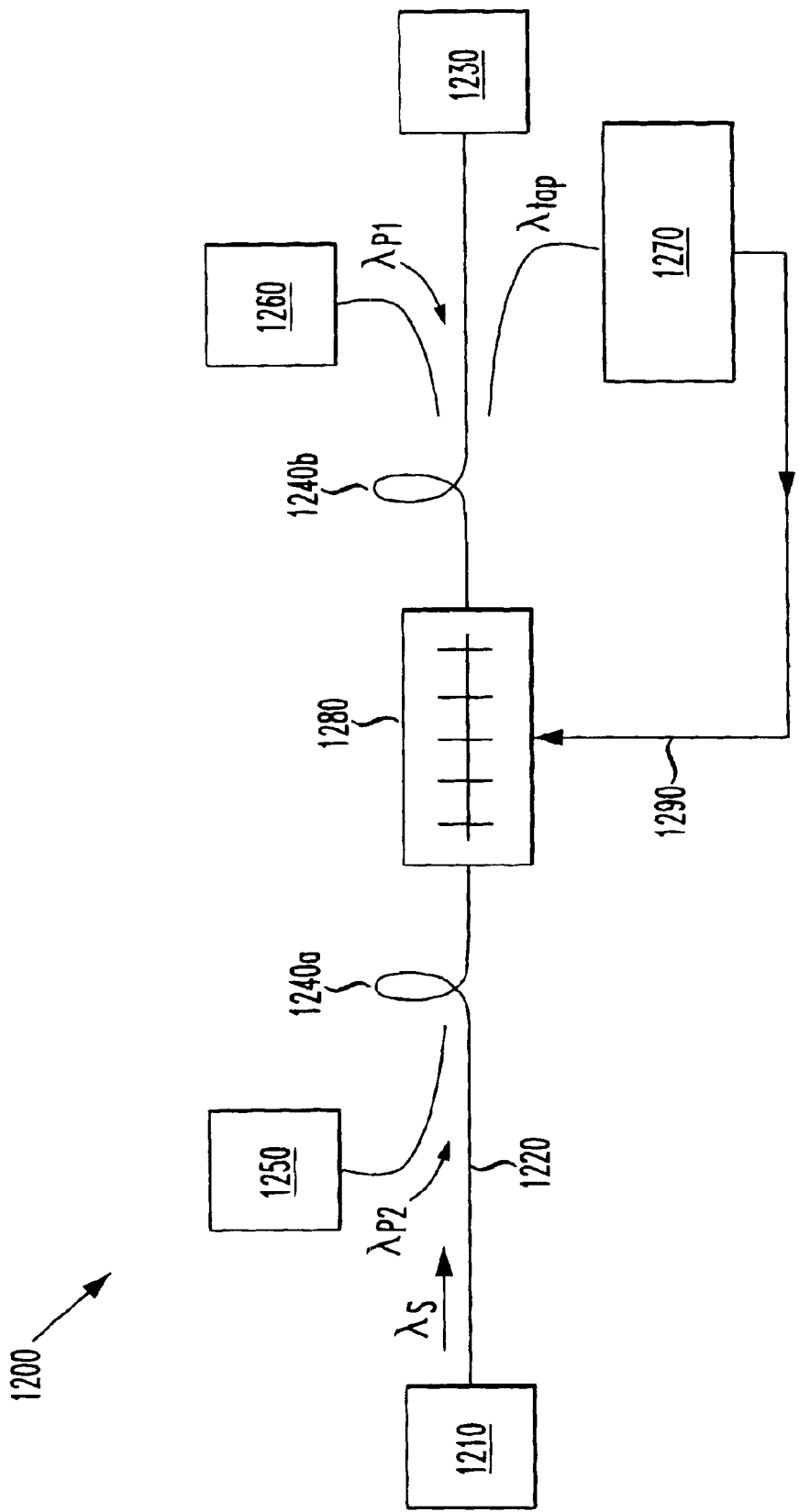

Referring to FIG. 12, illustrated is an exemplary optical communication system comprising the MEMS device according to the invention. The system 1200 comprises dynamically gain-equalized optical amplifiers, a reconfigurable MEMS mirror-type spectral shaping device, and a feedback device. Specifically, the system 1200 comprises a transmitter source 1210 of optical signals such as a digitally modulated 1.55 μm signal, an optical signal path comprising a length of optical fiber 1220 for transmitting the signal, and a receiver 1230 for receiving and demodulating the signal. One or more optical amplifiers, such as erbium-doped fiber amplifiers 1240a, 1240b, are disposed in the optical signal path for amplifying the transmitted signal. The amplifiers are pumped by pump sources 1250, 1260, of optical energy having pump wavelengths $\lambda_{p1}$ and $\lambda_{p2}$.

One of the preferred uses of the device of FIG. 12 is to reduce spectral dependence in the gain output of an optical amplifier. For example, the characteristic gain spectrum of an erbium-doped optical fiber amplifier has a pair of gain peaks at about 1.53 $\mu$m and at about 1.56 $\mu$m. Thus, a signal at 1.53 $\mu$m will be amplified more than one at 1.54 $\mu$m, which would be disadvantageous in a wavelength division multiplexing (WDM) system.

By properly demultiplexing the optical signal and sending it to different light-reflecting mirrors for separately programmed attenuation of signal strengths, and by optional tuning of the mirror reflections via a feedback system, the gain spectrum of the amplifier device combination can be made substantially flat over a range of wavelengths. The tunable system 1280 comprises a demultiplexer in combination with a tunable light-reflecting MEMS mirror device and a multiplexer to put together the different wavelength channels into the optical fiber. The device 1280 is connected to a feedback system 1290, having a wavelength detector 1270 coupled to the fiber 1220 for detecting the wavelength response $\lambda_{tap}$. The feedback system 1290 automatically adjusts the tuning of the device 1280 depending upon $\lambda_{tap}$. Advantageously, system 1200 can be a WDM system using a plurality of different wavelength signals, e.g., $\lambda_{s1}$ and $\lambda_{s2}$, and a plurality of tunable MEMS mirror devices coupled to one or more detectors.

The inventive MEMS device can also be useful as a multi-channel optical add/drop device. Modern, high-density optical communications utilize wavelength division multiplexed communication systems which employ multiplexer/demultiplexer devices. In such systems, a "trunk" fiber carries optical signal channels at several wavelengths $\lambda_1, \lambda_2, \ldots \lambda_n$ and it is desirable to extract a single wavelength channel from the trunk fiber or to add a single wavelength channel onto the trunk. A wide variety of such devices can be made, for example, by interconnecting optical circulators and tunable fiber Bragg gratings. See, U.S. Pat. No. 5,781,677 by Jin et al. Typically the channel reflected by the grating is dropped to the trunk fiber or is added to the trunk. Gratings as described herein permit selection at the grating of which channel is dropped or added. The inventive MEMS device allows channel add/drop operation in a free-space mode thus providing a convenient capability to carry out the add/drop operations for many hundreds or even thousands of channels simultaneously.

Filters and attenuators are useful in communication systems to change the power levels of various signals. In modern communications systems, variable attenuators are becoming increasingly more important, especially in dense wavelength-division multiplexed (DWDM) systems. Variable attenuators are used to vary the amount of loss light will experience as it passes through the system. This loss may range from low loss (<1 dB), to very high loss (>30 dB). The mechanism by which the attenuators induce loss in the signals may be attributable to coupling loss between fibers, polarization loss, absorption loss, scattering loss, or any combination of these.

Variable attenuators typically include complicated structures with moving parts that rotate or otherwise move the position of the fibers or a separate attenuator device. For example, U.S. Pat. No. 5,745,634 to Garrett, et al., "Voltage Controlled Attenuator," issued Apr. 28, 1998, shows a variable attenuator with which the variation in attenuation is obtained by actuating a DC motor which displaces the position of the attenuator. U.S. Pat. No. 5,677,977 to Smith, "Optical Attenuator," issued Oct. 14, 1997, shows a variable attenuator with which the variation in attenuation is obtained by providing a circular loop of optical fiber which is rotated with use of a lockable rotating shaft clamped to the side of the loop. U.S. Pat. No. 5,781,341 to Lee, "Motorized Tunable Filter and Motorized Variable Attenuator," issued Jul. 14, 1998, shows a variable attenuator with use of a cam attached to a collimator; the cam rotates the collimator to adjust the loss.

A variable attenuator based on coupling loss is typically composed of two separated fibers whose separation is controlled with mechanical motion. As the amount of the separation between the fibers increases, the amount of loss also increases. See, for example, Brenner et al., "Low-Reflectivity In-Line Variable Attenuator Utilizing Optical Fiber Tapers," J. LIGHTWAVE TECH., Vol. 18 (1990), at p. 7, which is incorporated herein by reference.

Figure 13:
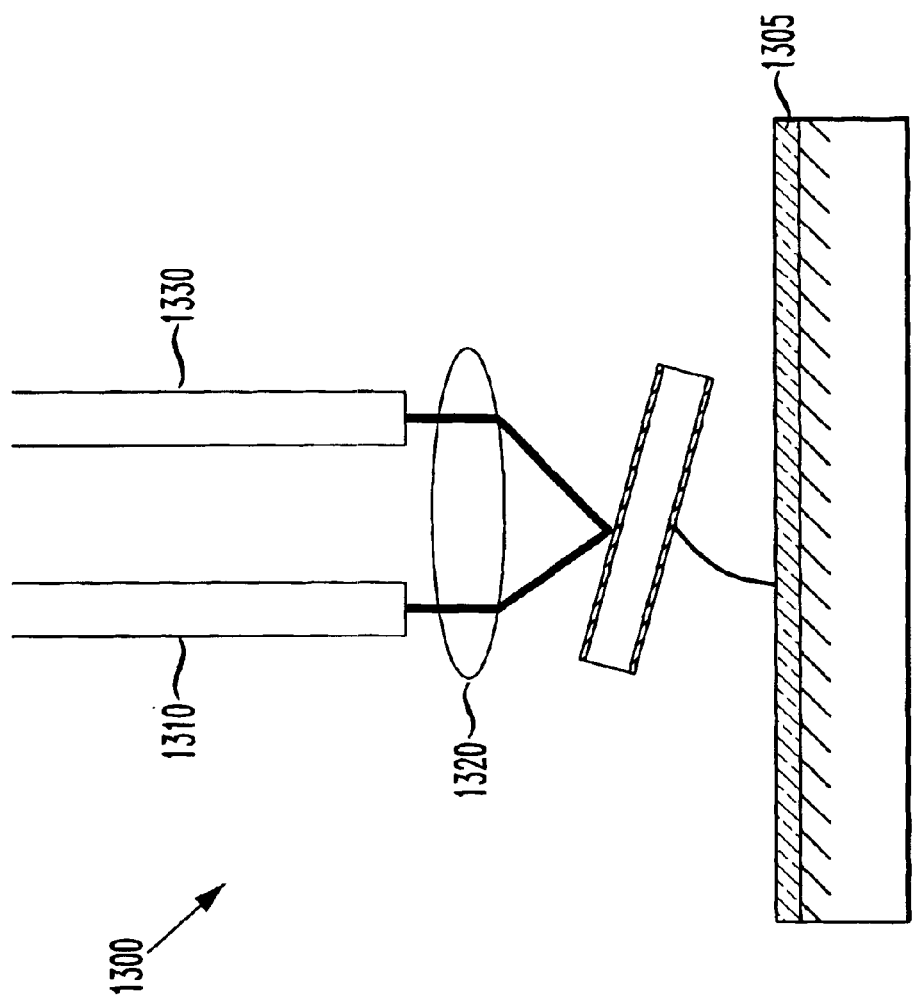

As can be seen, variable attenuators typically have involved use of bulk moving parts and are not always amenable to small, high-density device arrays. As may be appreciated, those concerned with the development of optical communications systems continually search for new components and designs including new attenuator designs. As optical communications systems become more advanced, there is growing interest in reducing the dimension of the attenuator devices, and in increasing the number of wavelength channels that may be transmitted, relayed, modulated/attenuated, filtered, or switched. The instant invention comprising the inventive charge dissipation layer 1305, such as schematically illustrated in FIG. 13, provides a variable attenuator device that may be used to reliably achieve desired signal attenuation in many channels. Also included within the embodiment shown in FIG. 13, are a first fiber optic line 1310, a lense 1320, the charge dissipation layer 1305 and a second offset fiber optic line 1330.

Although the present invention has been described in detail, those skilled in the art should understand that they can make various changes, substitutions and alterations herein without departing from the spirit and scope of the invention in its broadest form.

What is claimed is:

1. A micro-electro-mechanical system (MEMS) device, comprising:

a substrate;

an electrode located in contact with the substrate;

a charge dissipation layer having an electrical resistivity ranging from about 1E2 ohm-cm to about 1E12 ohm-cm located proximate and electrically coupled to the substrate; and a moveable element located over the electrode.

2. The micro-electro-mechanical system (MEMS) device as recited in claim 1 wherein the charge dissipation layer is a tunable charge dissipation layer.

3. The micro-electro-mechanical system (MEMS) device as recited in claim 1 wherein the charge dissipation layer comprises a conductive or semi-conductive material.

4. The micro-electro-mechanical system (MEMS) device as recited in claim 1 wherein the charge dissipation layer comprises a material selected from the group of materials consisting of:

cobalt iron oxide;

nickel iron oxide;

nickel zinc iron oxide;

manganese zinc iron oxide; and iron-iron oxide.

5. The micro-electro-mechanical system (MEMS) device as recited in claim 1 wherein the charge dissipation layer comprises a material selected from the group of materials consisting of:
   gadolinium iron oxide;
   lanthanum nickel oxide;
   lanthanum cobalt oxide;
   lanthanum chromium oxide;
   lanthanum manganese oxide;
   lanthanum strontium manganese oxide;
   lanthanum calcium manganese oxide; and
   yttrium barium copper oxide.

6. The micro-electro-mechanical system (MEMS) device as recited in claim 1 wherein the charge dissipation layer comprises a single or multi-oxide material containing a valence defect.

7. The micro-electro-mechanical system (MEMS) device as recited in claim 1 wherein the substrate comprises a material susceptible to a static charge build-up.

8. The micro-electro-mechanical system (MEMS) device as recited in claim 1 wherein the charge dissipation layer has an electrical resistivity ranging from about 1E5 ohm-cm to about 1E9 ohm-cm.

9. The micro-electro-mechanical system (MEMS) device as recited in claim 1 wherein the charge dissipation layer has a thickness ranging from about 5 nm to about 100 nm.

10. The micro-electro-mechanical system (MEMS) device as recited in claim 1 wherein the charge dissipation layer is located on the substrate but under the electrode.

11. The micro-electro-mechanical system (MEMS) device as recited in claim 1 wherein the charge dissipation layer is located on the substrate and over the electrode.

12. The micro-electro-mechanical system (MEMS) device as recited in claim 1 wherein the electrode is a first electrode, and further including a second electrode positioned proximate the first electrode, and wherein the charge dissipation layer is located in an inter-electrode gap created by the first and second electrodes.

13. A method of manufacturing a micro-electro-mechanical system (MEMS) device, comprising:
   providing a substrate;
   creating an electrode in contact with the substrate;
   forming a charge dissipation layer having an electrical resistivity ranging from about 1E2 ohm-cm to about 1E12 ohm-cm proximate and electrically coupled to the substrate; and
   placing a moveable element over the electrode.

14. The method as recited in claim 13 wherein providing a substrate includes providing a substrate comprising a material susceptible to a static charge build-up.

15. The method as recited in claim 13 further including tuning a resistivity of the charge dissipation layer using a post-formation heat treatment.

16. The method as recited in claim 13 wherein forming the charge dissipation layer includes forming the charge dissipation layer using a material selected from the group of materials consisting of:
   cobalt iron oxide;
   nickel iron oxide;
   nickel zinc iron oxide;
   manganese zinc iron oxide;
   iron—iron oxide;
   gadolinium iron oxide;
   lanthanum nickel oxide;
   lanthanum cobalt oxide;
   lanthanum chromium oxide;
   lanthanum manganese oxide;
   lanthanum strontium manganese oxide;
   lanthanum calcium manganese oxide;
   yttrium barium copper oxide; and
   a single or multi-oxide material containing a valence defect.

17. The method as recited in claim 13 wherein forming the charge dissipation layer includes forming the charge dissipation layer having an electrical resistivity ranging from about 1E5 ohm-cm to about 1E9 ohm-cm.

18. The method as recited in claim 13 wherein forming the charge dissipation layer includes forming the charge dissipation layer having a thickness ranging from about 5 nm to about 100 nm.

19. The method as recited in claim 13 wherein forming the charge dissipation layer includes forming the charge dissipation layer on the substrate but under the electrode, forming the charge dissipation layer on the substrate and over the electrode, or forming the charge dissipation layer in an inter-electrode gap created by the electrode and a second electrode.

20. The method as recited in claim 13 wherein forming the charge dissipation layer includes fanning the charge dissipation layer using a process selected from the group of processes consisting of:
   reactive sputtering;
   radio frequency (RF) sputtering;
   co-sputtering;
   e-beam evaporation;
   electro-deposition;
   ion-beam evaporation; and
   chemical vapor deposition.

21. The optical communications system recited in claim 20 wherein the micro-electro-mechanical system (MEMS) device is a surface machined micro-electro-mechanical system (MEMS) device or a two-part SOI micro-electro-mechanical system (MEMS) device.

22. An optical communications system, comprising:
   input/output fiber bundles;
   a micro-electro-mechanical system (MEMS) device, comprising;
      a substrate;
      an electrode located over in contact with the substrate;
      a charge dissipation layer having an electrical resistivity ranging from about 1E2 ohm-cm to about 1E12 ohm-cm located proximate and electrically coupled to the substrate; and
      a moveable element located over the electrode;
   imaging lenses interposed between the input/output fiber bundles and the micro-electro-mechanical system (MEMS) device; and
   a reflector.

23. The optical communications system recited in claim 22 that comprises one or more devices selected from the group consisting of:
   a micro-electro-mechanical system (MEMS) cross connect system;
   an optical power gain equalizer system;
   a wavelength division multiplexing telecommunications system;
   a light signal switch in an optical communications system; and
   a variable optical attenuator in an optical communications system.

* * * * *